United States Patent [19]
Friedman

[11] Patent Number: 6,053,478
[45] Date of Patent: Apr. 25, 2000

[54] WAFER HOIST WITH SELF-ALIGNING BANDS

[75] Inventor: Gerald M. Friedman, New Ipswich, N.H.

[73] Assignee: PRI Automation, Inc., Billerica, Mass.

[21] Appl. No.: 09/115,974

[22] Filed: Jul. 15, 1998

[51] Int. Cl.[7] ................................................ B66D 1/00
[52] U.S. Cl. .................... 254/332; 254/278; 254/288; 254/329; 212/274
[58] Field of Search ................................. 254/221, 264, 254/278, 288, 329, 332; 212/71, 274, 330, 331

[56] References Cited

U.S. PATENT DOCUMENTS

| | | | |
|---|---|---|---|
| 1,189,611 | 7/1916 | Morse | 226/192 |
| 1,833,180 | 11/1931 | Robins | 198/806 |
| 2,262,325 | 11/1941 | Kendall | 198/806 |
| 2,330,923 | 10/1943 | Robins | 198/806 |
| 3,107,791 | 10/1963 | Michael | 212/274 |
| 4,174,171 | 11/1979 | Hamaker et al. | 355/3 BE |
| 4,196,803 | 4/1980 | Lovett | 198/806 |
| 4,397,538 | 8/1983 | Castelli et al. | 355/3 BE |
| 5,246,099 | 9/1993 | Genovese | 198/807 |
| 5,387,962 | 2/1995 | Castelli et al. | 355/212 |
| 5,659,851 | 8/1997 | Moe et al. | 399/165 |
| 5,673,804 | 10/1997 | Weiss et al. | 212/274 |

FOREIGN PATENT DOCUMENTS

| | | | |
|---|---|---|---|
| 242101 | 12/1962 | Australia | 254/329 |

*Primary Examiner*—Donald P. Walsh
*Assistant Examiner*—Emmanuel M. Marcelo
*Attorney, Agent, or Firm*—Weingarten, Schurgin, Gagnebin & Hayes LLP

[57] ABSTRACT

A hoist system including a roller assembly which is allowed to pivot as a suspending member is rolled up around a drum compensates for lateral forces and allows a load on the suspending member to remain centered under the roller assembly. The drum has a shaft mounted through the center with a resilient coupling between the shaft and the drum which allows transfer of rotational torque while allowing the drum to pivot. Such a coupling can be furnished by a pair of concentric rings around the shaft having pivot holes orthogonal to the shaft axis. The innermost ring is connected by a pair of pivot pins to the shaft. The outermost ring is connected to the innermost ring by another pair of pivot pins perpendicular to the pivot pins through the shaft. The outermost ring is attached to the inside of the drum. The drum and outermost ring are allowed to pivot around the axis through pivot pins in the outermost ring, and the drum, outermost ring and innermost ring are allowed to pivot around the perpendicular axis through the pivot pins in the shaft.

30 Claims, 7 Drawing Sheets

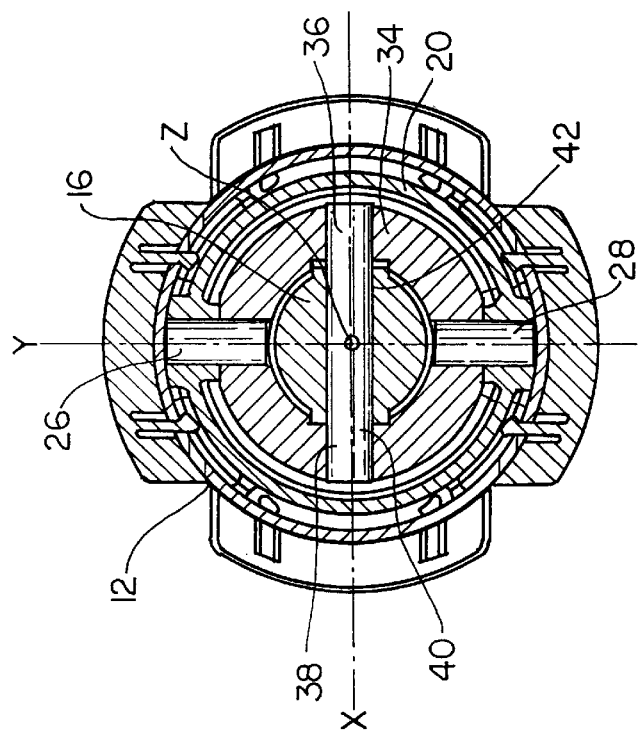
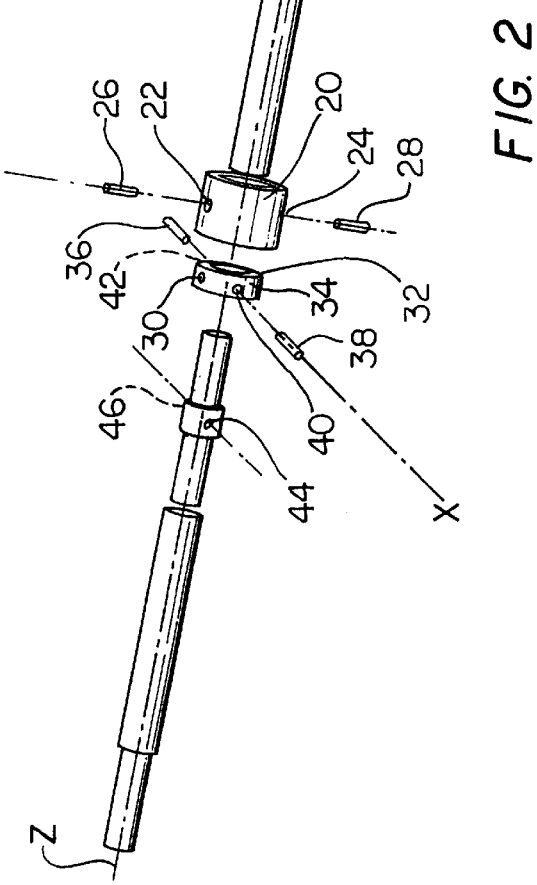

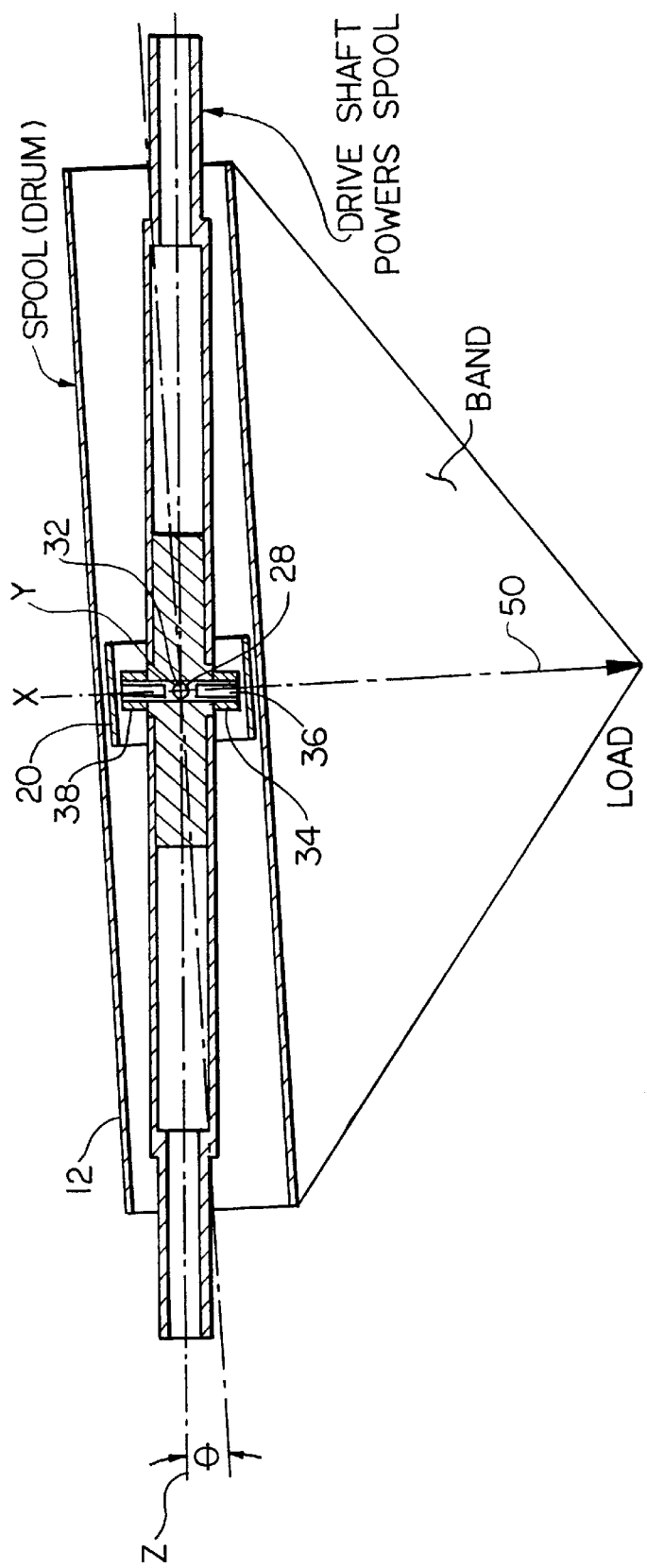
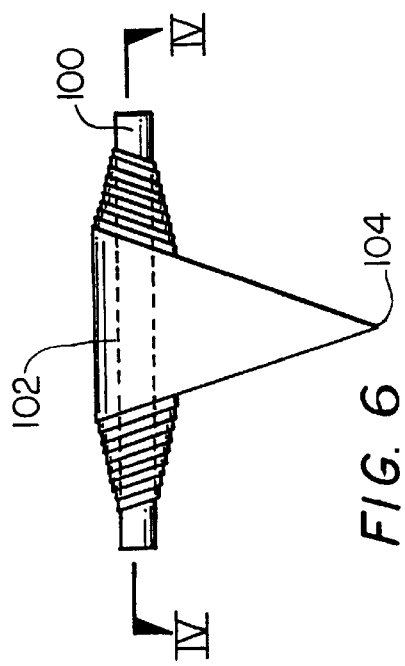
FIG. 4
FIG. 6

WAFER HOIST WITH SELF-ALIGNING BANDS

CROSS REFERENCE TO RELATED APPLICATIONS

N/A

STATEMENT REGARDING FEDERALLY SPONSORED RESEARCH OR DEVELOPMENT

N/A

BACKGROUND OF THE INVENTION

A manufacturing operation often entails the use of hoists to manipulate items. In a semiconductor wafer fabrication line, hoists are used to lift wafer stock during various phases of the wafer fabrication process. Such a hoist is typically mounted on an overhead rail system, allowing hoisted items to be moved around the facility. Items are raised and lowered by such a hoist onto processing stations, where various wafer treatment operations are performed.

One type of hoist system has three roller assemblies in a triangular orientation with a wide suspending member, or band, attached to a rotating drum. See, for example, U.S. Pat. No. 5,673,804, issued Oct. 7, 1997, entitled Hoist System Having Triangular Tension Members, and assigned to the assignee of the present application, the disclosure of which is incorporated herein by reference. In this type of hoist, items are hoisted by rotating the drums such that the band is wrapped around it, drawing objects upwards.

For this type of system to operate effectively the band must be wound such that its centerline is wrapped up over itself consistently with each revolution of the drum. For a band to wrap onto a drum in this manner, the band must be mounted to the drum so that the center line remains perpendicular to the drum. Tension in the band must therefore also be maintained perpendicular to the drum. Since the load being carried by the hoist is suspended from the free end of the band, the band tends toward a vertical orientation. A line of force along the center of the band defines the lifting force and likewise has a tendency to remain vertical due to gravity. The drum must therefore be oriented horizontal, perpendicular to the band, which requires that the hoist housing in which the drum is mounted also be horizontal. However, the overhead rail system that a hoist is suspended from is not an unyielding structure, therefore it cannot always maintain the hoist housing at a precise horizontal orientation. Further, factors such as air currents in the manufacturing facility, imperfections in the band material, and friction between the band and drum can also contribute to the deviation of the load from vertical. Such deviation creates a tendency for the band to "walk" off the end of the drum, causing it to bunch up at one end of the roller and resulting in an uneven load, increased band wear, and even failure to unroll and lower the hoisted object.

Such hoisting operations are further challenged by the requirement of a substantially contaminant free environment required for wafer fabrication operations. Particulate contaminants, such as dust, dirt and other particles, must be minimized. Therefore, moving parts must be constructed of materials resistant to physical abrasion and deterioration. Lubricants between moving parts must also be carefully chosen to avoid aggravating the presence of foreign material. For this reason, high band ridges on the drum edge which steer the band by frictional forces are undesirable.

It would be beneficial to develop a roller assembly which keeps the band centered on the drum as it is rolled without increasing friction, abrasion, and lubricant usage which compromise the substantially contaminant-free environment required for wafer processing.

BRIEF SUMMARY OF THE INVENTION

A hoist system with a roller assembly in which the drum is allowed to pivot slightly as the band is rolled compensates for misalignment of the housing from the horizontal and also for any lateral force at the free end of the band which might cause the line of force in the band to deviate from the vertical direction. The pivoting of the drum allows the drum to remain perpendicular to the line of force in the band at all times since the line of force has a tendency to remain perpendicular to the path of the load regardless of the orientation of mounting. In accordance with the present invention, a hollow drum has a shaft mounted through the center. A coupling between the shaft and the inner surface of the drum allows transfer of rotational torque, but also allows the drum axis to pivot slightly from parallel to the axis of the shaft. In the preferred embodiment such a coupling is furnished by a pair of concentric rings having pivot holes mounted around the shaft. The innermost ring is connected by a pair of pivot pins to the shaft. The outermost ring is connected to the innermost ring by another pair of pivot pins perpendicular to the pivot pins through the shaft. The outermost ring is further attached to the inner surface at the center of the hollow drum, thereby connecting the shaft and drum through a gimbal ring assembly. Therefore, the drum and outermost ring are allowed to pivot around the axis defined by the pivot pins through the outermost ring, and the drum, outermost ring and innermost ring are allowed to pivot around the perpendicular axis defined by the pivot pins through the shaft. As the drum rotates, the concentric rings which permit rotation around two perpendicular axes both orthogonal to the axis of the shaft can accommodate a tendency of the load to deviate from a direction perpendicular to the middle of the shaft, thereby keeping the load centered and the drum aligned perpendicular to the load.

BRIEF DESCRIPTION OF THE SEVERAL VIEWS OF THE DRAWING

FIG. 2 is an exploded isometric view of the roller assembly;

FIG. 3 is a cross-sectional view of the roller along a plane orthogonal to the axis of rotation of the shaft;

FIG. 4 is a vertical cross sectional view of the roller assembly of FIG. 6 with the drum pivoted slightly away from the axis of the shaft;

FIG. 6 is a side view of the roller assembly with a band rolled around the drum;

DETAILED DESCRIPTION OF THE INVENTION

Figure 1:
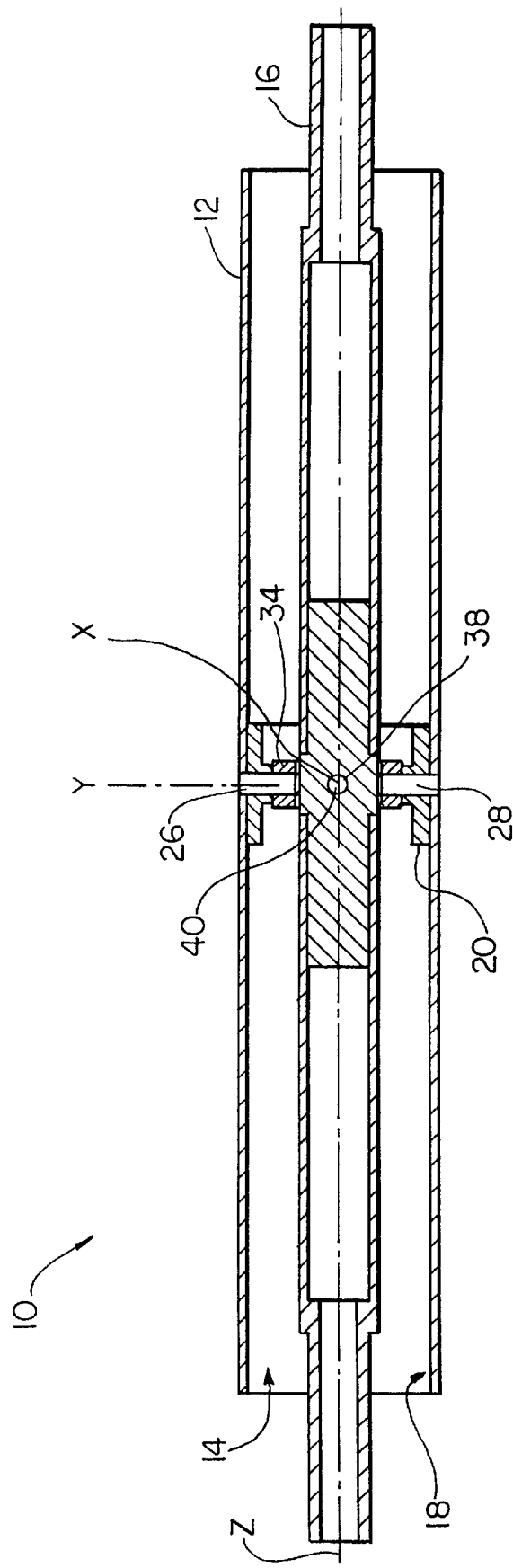
FIG. 1 is a horizontal cross-sectional view of one of the roller assemblies of FIG. 5 along the axis of rotation of the shaft.
Figure 7:
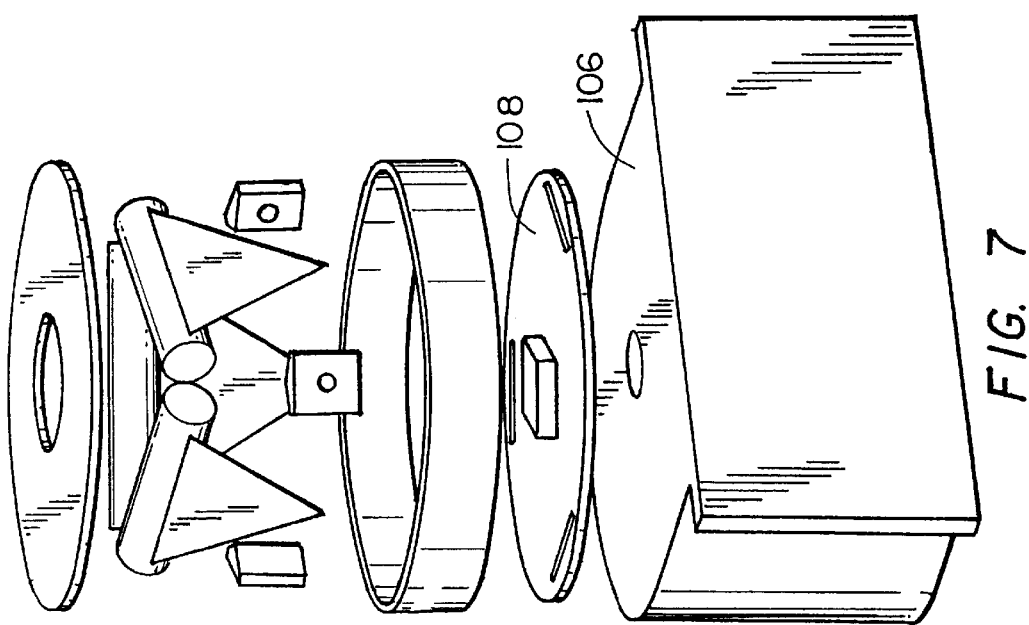
FIG. 7 is an exploded isometric view of a hoist and wafer stock load.
Figure 5:
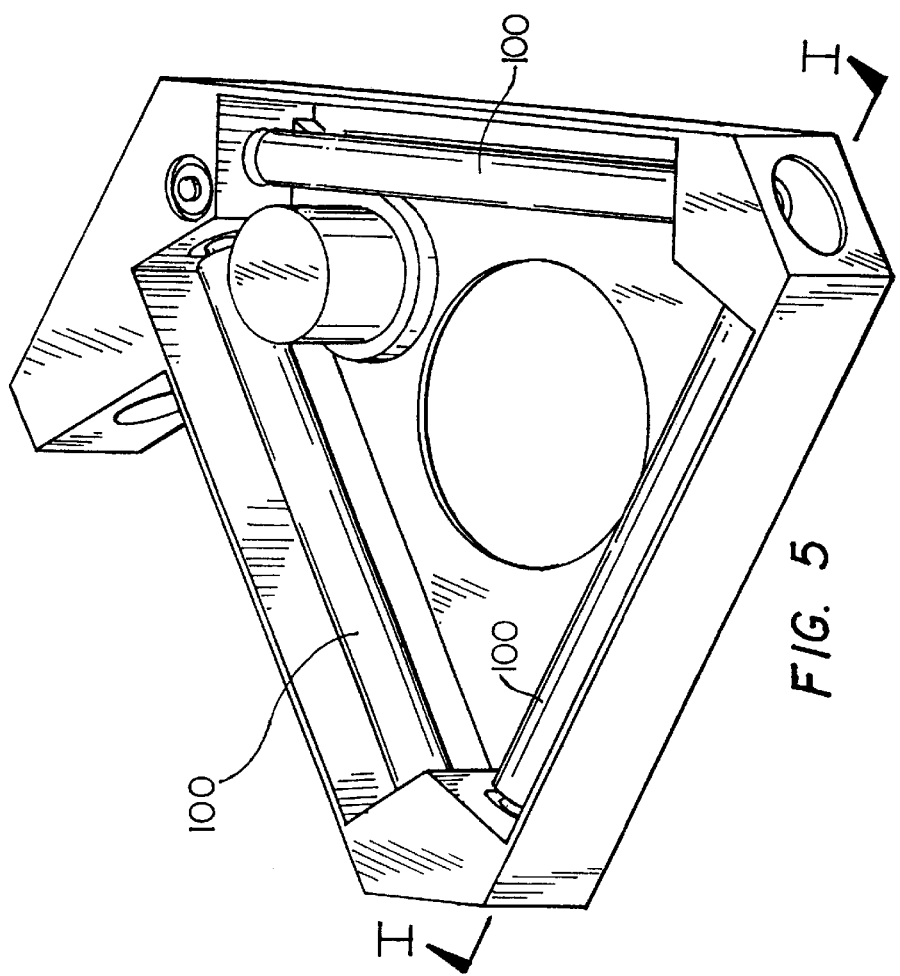
FIG. 5 shows a hoist comprising three roller assemblies in a triangular orientation.

FIGS. 5–7 illustrate a hoist system incorporating a roller assembly according to the present invention. The hoist system includes a housing, which may be mounted for movement along a track or rail (not shown), and three or more of such roller assemblies mounted for rotation within the housing. A band is connected at one end to the roller assembly and is connectable at an opposite end to a load. As the roller assembly is rotated, the band is rolled or unrolled upon the roller assembly, thereby lifting or lowering the load.

As shown in FIGS. 1–4, each roller assembly 10 comprises a shaft 16 which is mounted for rotation to the housing about an axis Z. A motor or other suitable drive mechanism is coupled to the shaft to provide the rotation. A hollow outer drum 12 is provided surrounding the shaft. The drum and the shaft are connected by a coupling which allows the drum to pivot slightly with respect to the shaft about two orthogonal axes X and Y which are fixed with respect to the shaft and orthogonal to the Z axis. The intersection of the X and Y axes is located at approximately the midpoint of the shaft.

In a preferred embodiment, the coupling comprises two pairs of pivot pins, each perpendicular to each other and substantially orthogonal to the Z or rotary axis. The pins are positioned in concentric rings between the shaft and the inside surface of the drum. The pair of rings, outer ring 20 and inner ring 34, each allowed to pivot on a perpendicular axis with respect to the other, therefore allow the drum to pivot slightly about the axis substantially parallel to the shaft axis of rotation, while the axes defined by the pair of pivot pins rotates with the shaft and remain substantially orthogonal to the shaft axis of rotation.

More particularly, the outer ring 20 has Y-axis pivot holes 22, 24; the inner ring 34 has pivot holes 40, 42; and the shaft has pivot holes 44, 46. The outer ring 20 is attached in any suitable manner within the drum 12 and fixed with respect to drum 12. The inner ring 34 is pivotably attached to the shaft 16 by X-axis pivot pins 36, 38 which extend from the inner ring pivot holes 40, 42 through the shaft pivot holes 44, 46. The outer ring 20 is pivotably attached to the inner ring by Y-axis pivot pins 26, 28 which extend through the outer ring Y-axis pivot holes 22, 24 and into the inner ring 34 through the inner ring Y-axis pivot holes 30, 32.

As the shaft rotates, the band may "walk" toward one end of the shaft if the center of gravity of the load shifts out of alignment with the intersection of the X and Y axes. In that case, the drum is able to pivot about the X and Y axes to compensate for this shifting, thereby tending to shift the center of gravity of the load back into alignment with the intersection of the X and Y axes. FIG. 4 illustrates the case in which the X axis is vertically disposed and the Y axis is horizontally disposed. In this case, the drum 12 is pivoted as indicated by an angle θ from the Z axis, and the torque is absorbed by the Y axis pins 26, 28. As the shaft and drum continue to rotate, the torque is borne increasingly by the X axis pins 36, 38, until the shaft and drum have rotated a quarter turn, at which point the torque is borne fully by the X axis pins.

In this manner, the drum 12 is allowed to pivot at any rotation as the Y-axis pivot pins 26, 28 and X-axis pivot pins 36, 38 each absorb the component of movement in their respective directions. As these pivot pins rotate freely within the corresponding pivot holes, the drum 12 freely pivots as the load force 50 varies slightly from a true perpendicular to rotary axis Z, thereby absorbing variations from a consistently centered load due to such elements as imprecise horizontal leveling of the housing, wind currents, band imperfections, and friction as the band is drawn around the drum. Typically, a pivot range of at least 3° is sufficient to absorb and correct most forces which tend to deviate the load from center.

A roller assembly as defined above is typically used to hoist cassettes containing wafer stock in a wafer processing environment. Such a roller assembly is typically disposed in a triangular arrangement involving three rollers 100, as depicted in FIG. 5. A triangular band 102 wound around such a roller is depicted in FIG. 6. The arrangement of three roller assemblies 100 winding triangular bands 102 which taper to a point thereby define the plane 108 of the top surface of the cassette 106, as shown in FIG. 7. Such arrangement insures that each band 104 bears an equal load, and also eliminates unnecessary lateral band area above the cassette, as band area on either side of the tapered point would provide little lifting force. By equalizing load forces in the bands 102, and by focusing the load to point 104, below the center of the roller assembly 100, a substantially perpendicular load path is provided, thereby allowing the roller assembly (10, FIG. 1) to absorb forces which would otherwise result in band misalignment causing the band to "walk" off the center of the drum 12.

Figure 8:
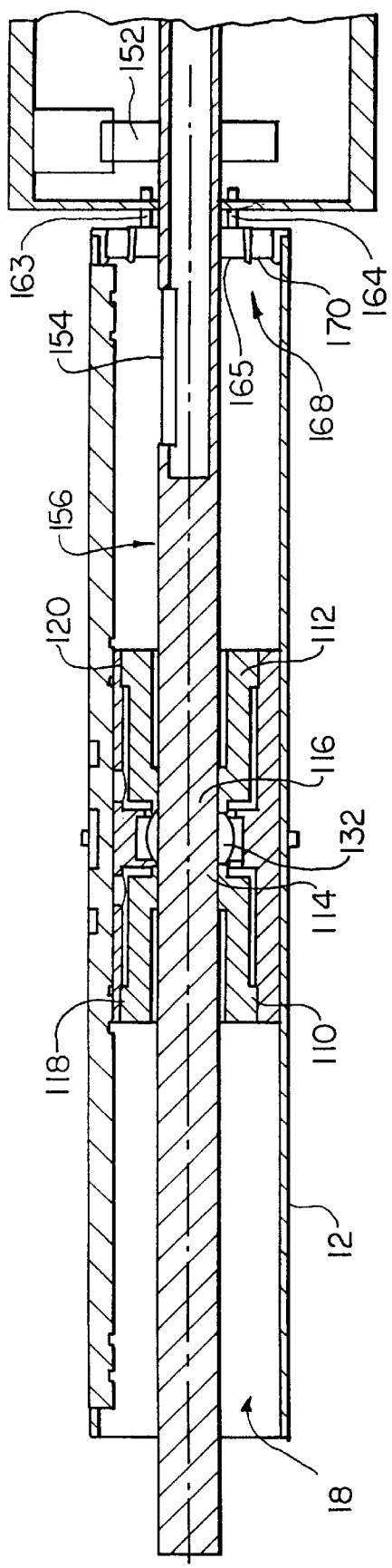
FIG. 8 shows a cross section of an alternative roller assembly embodiment along the roller axis.
Figure 9:
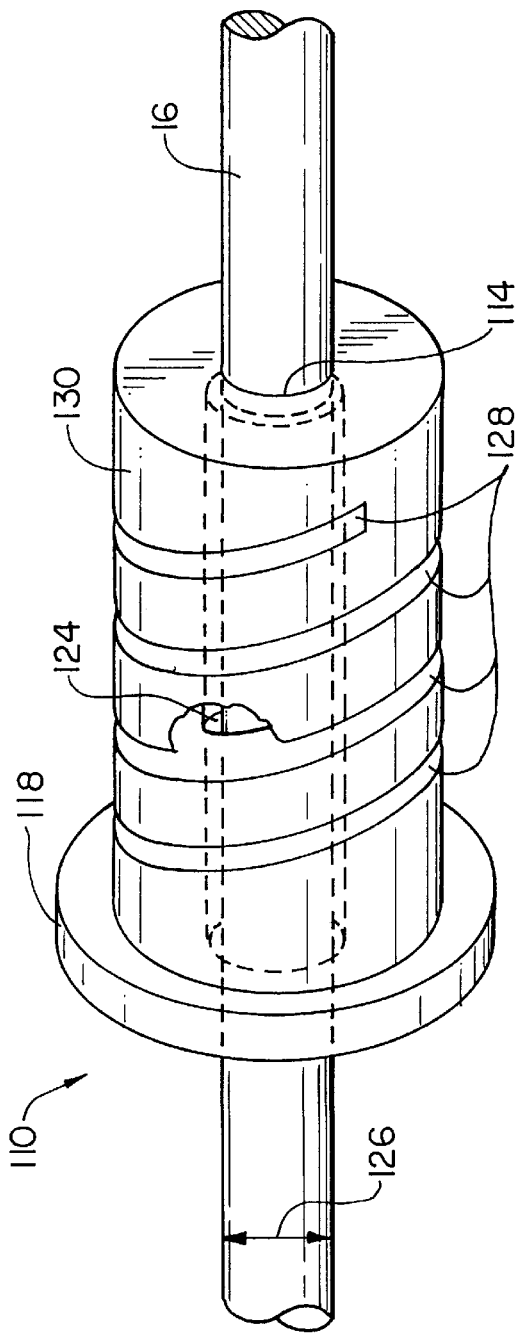
FIG. 9 shows a perspective view of a resilient hub as shown in FIG. 8.

An alternative roller assembly is shown in FIG. 8. Resilient hubs 110, 112 are fixed to the shaft 16. The hubs may have a spring-like configuration 128 or may be formed of a suitable resilient or elastomeric material. The resilience of the hubs is chosen to retain the shaft 16 in torquing configuration with drum 12, yet provide resilient pivoting of the drum 12 while biasing the shaft concentrically about the inner wall 18. The resilient hubs 110, 112 may be connected to the shaft in any suitable manner, such as by frictionally fitting the shaft through opening 114 in the hubs. The openings are preferably symmetrically located around a point proximate to the midpoint of the drum 12. The resilient hubs 110, 112 may be connected to the drum in any suitable manner, such as by a frictional fit between the inner wall 18 of the drum and the lips 118, 120, of the hubs, at points on the hubs symmetrically spaced from the midpoint of the drum. A shaft gap 124 between the shaft and the inner surface of the hubs is provided. The gap is slightly wider than the shaft diameter 126, allowing movement of shaft within the range of shaft gap 124. Pivotal movement of drum 12 is effected through deformation of the resilient hubs. A spherical center bearing 132, in FIG. 8, fixes the midpoint of the shaft 16 concentrically with the drum 12, thereby providing a center pivot point about which the resilient hubs 110, 112 deflect in complementary directions, rather than both deflecting the same direction. As the resilient hubs 110, 112 bias the drum 12 concentrically around shaft 16, load centering can be effected with greater loads than can be achieved with the embodiment disclosed above.

Figure 10:
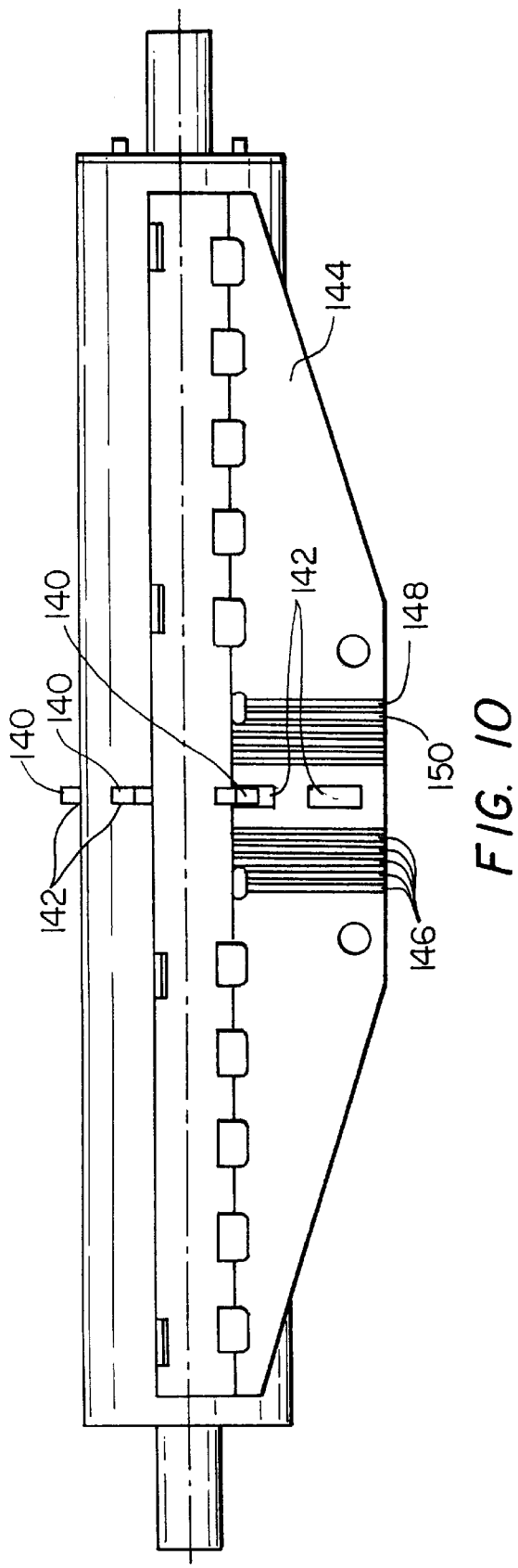
FIG. 10 shows an alternative drum embodiment having guide sprockets.
Figure 12:
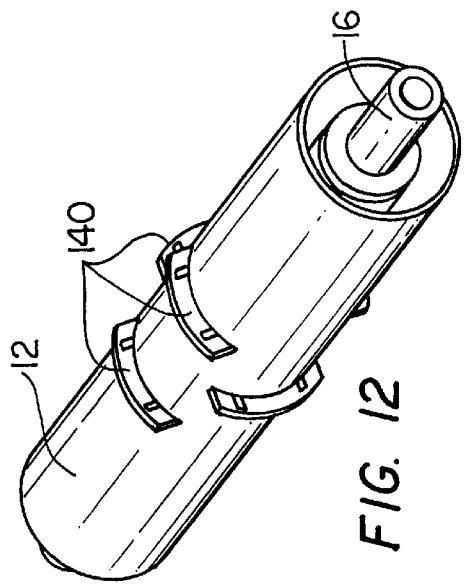
FIG. 12 shows an alternative sprocket arrangement.
Figure 11:
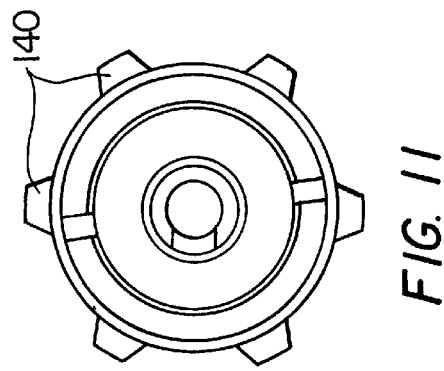
FIG. 11 shows a cross section of the roller assembly in FIG. 8 along the plane orthogonal to the axis of rotation.

Referring to FIGS. 10–12, a series of cogs 140 in a sprocket fashion can be provided in addition to the pivoting couplings described above to further overcome lateral forces which tend to drive the band off-center. Such cogs engage apertures 142 in the band surface 144 to overcome small deflective forces. The cogs can be mounted in a single ring or as a series of interleaving rings, as shown in FIG. 12. By mounting the cogs 140 in an interleaving manner, and by elongating them collectively 360° around the drum 12, a band will always be in communication with at least one cog 140.

In a further embodiment, electrical conductors 146, shown in FIG. 10, are provided by embedding continuous metallic traces into the band surface. Such conductors can provide control and power signals to a cassette or other member to be hoisted. The conductors 146 are attached through cavities 154 in the shaft 16, or alternatively through flat conductors 156 on the shaft surface, and are connected to slip ring 152, providing rotational electrical coupling to fixed circuitry (not shown). Such traces could alternatively function as reinforcement members to increase the strength of the band. Similarly, alternating traces could be used to provide a combination of electrical control and strength, as shown by alternating traces 148 & 150.

Figure 14:
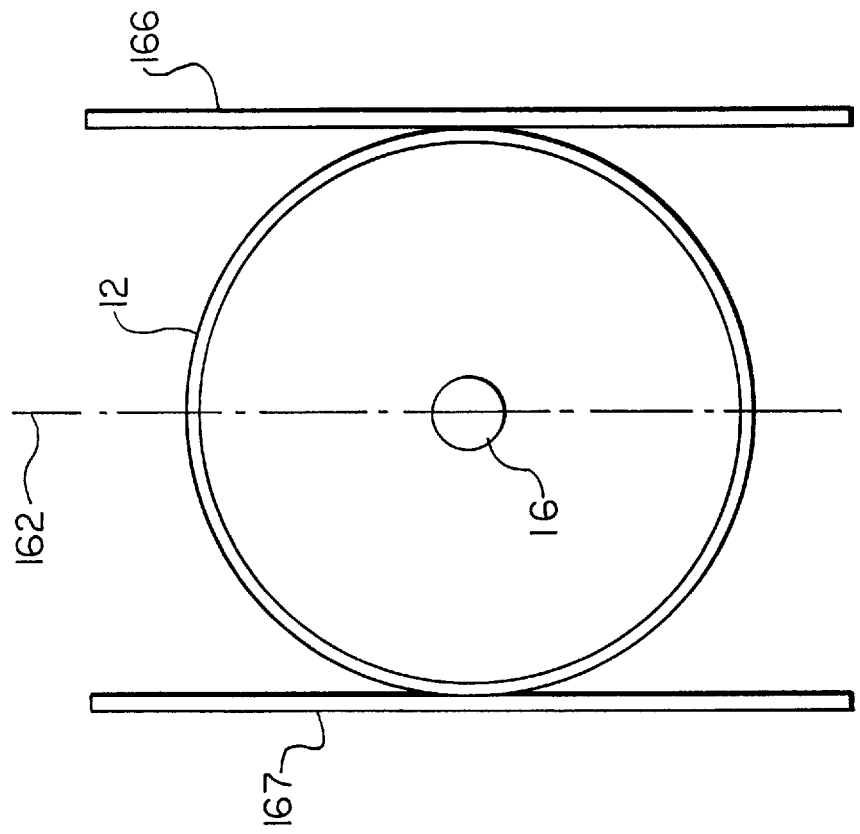
FIG. 14 shows an alternate embodiment of the anti-nutation assembly.
Figure 13:
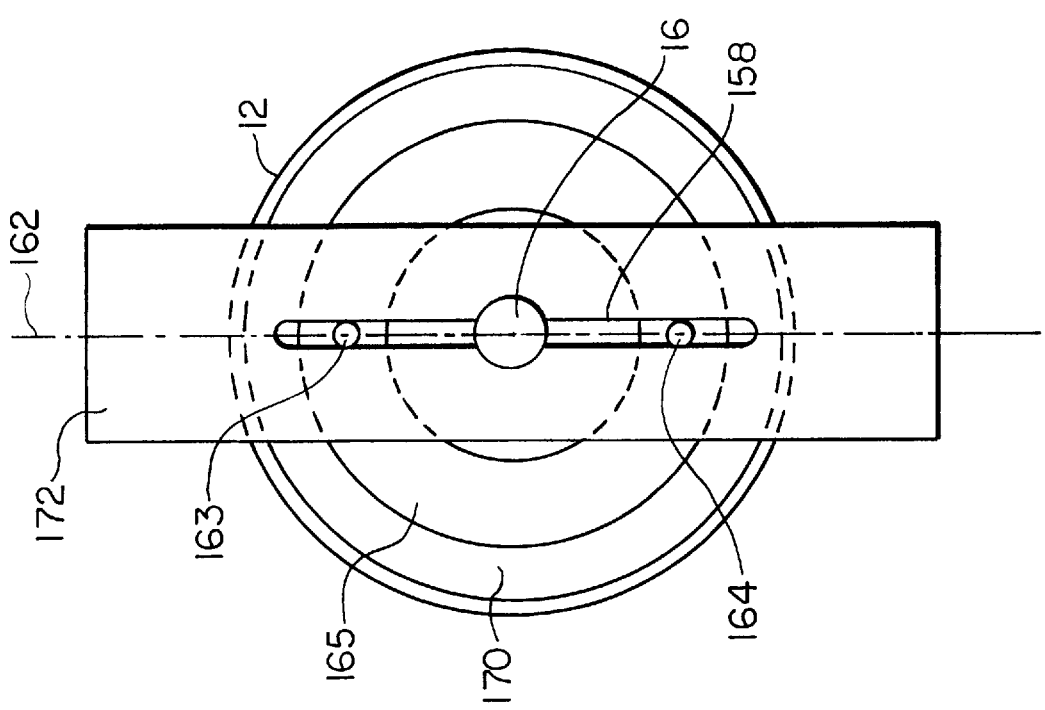
FIG. 13 shows an anti-nutation assembly restraining the shaft.

A further embodiment provides for an anti-nutation assembly to restrict drum pivot movement to the vertical plane 162. Such an assembly includes a slot 158 in the housing 172, fixed in the vertical direction with respect to the shaft 16. Two anti-nutation pins 163 and 164, (FIGS. 8 and 13) are mounted opposed from each other on the inner race 165 of a bearing 168, which rotates within the outer race 170 attached to the inside of one end of the drum 12. The anti-nutation pins 163 and 164 engage the slot 158, and restrict drum 12 travel with respect to shaft 16 to the vertical plane 162. The bearing 168 permits the drum to rotate relative to the vertical plane 162. An alternative embodiment to the anti-nutation assembly is shown in FIG. 14. Two wear strips 166 and 167 are fixed to the hoist housing in the vertical direction on opposed sides of the drum 12 such that the drum 12 travel is restricted to the vertical plane 162.

As various extensions and modifications to the above embodiments, particularly with respect to material choice of resilient and anti-abrasive elements, will be apparent to those skilled in the art, the present invention is not intended to be limited except as indicated by the following claims.

I claim:

1. A hoist system for lifting and lowering objects, the hoist system comprising:
    a housing and a plurality of roller assemblies mounted to the housing for rotation, each roller assembly including a suspending member having one end attached to the roller assembly and having an opposite end attachable to a load,
    at least one of the roller assemblies comprising:
        a drum having a hollow bore therethrough, the one end of the suspending member fixed to the drum;
        a shaft, having a longitudinal axis, disposed through said hollow bore of said drum and rotatably mounted to the housing for rotation about the longitudinal axis; and
        a coupling between said shaft and said drum disposed to allow pivotal movement of the drum independent of the shaft in response to shifting of a load attached at the opposite end of the suspending member.

2. The hoist system of claim 1, wherein the longitudinal axis of the shaft remains fixed with respect to the housing.

3. The hoist system of claim 1, wherein the coupling is further configured to allow pivotal movement of said drum about a plurality of pivot pins defining two orthogonal axes, said orthogonal axes further being orthogonal to said longitudinal axis.

4. The hoist system of claim 3, wherein the coupling is disposed to allow pivotal movement of the drum within a range of 3° away from the longitudinal axis of the shaft.

5. The hoist system of claim 3, wherein the coupling is disposed to allow pivotal movement of the drum in a vertical plane within a range of 3° away from the longitudinal axis of the shaft.

6. The hoist system of claim 3, wherein the coupling is disposed to allow pivotal movement of the drum to tend to return a center of gravity of the load to a point beneath the coupling.

7. The hoist system of claim 1, wherein said plurality of roller assemblies comprises three roller assemblies arranged in a triangular orientation.

8. The hoist system of claim 1, wherein the coupling further comprises:
    an outer ring attached within the hollow bore of the drum and having first opposed pivot holes aligned along a first axis;
    an inner ring substantially concentric to said outer ring, said inner ring having second opposed pivot holes along said first axis, wherein said outer ring and said inner ring are in pivotal communication along said first axis through pivot pins extending through said first and second opposed pivot holes, said inner ring further comprising third opposed pivot holes on a second axis perpendicular to said first axis;
    said first axis and said second axis both orthogonal to said shaft axis of rotation; and
    fourth opposed pivot holes through said shaft, said inner ring in pivotal communication with said shaft along said second axis through pivot pins extending through said third and fourth opposed pivot holes.

9. The hoist system of claim 1, wherein the coupling further comprises:
    at least one hub, said hub having a center bore and an outer rim and extending along a portion of said shaft;
    said center bore attached to said shaft and said outer rim attached within said drum, wherein a portion of said hub between said center bore and said outer rim is sufficiently deformable to allow relative movement between said shaft and said interior surface.

10. The hoist system of claim 9, wherein said hub biases said drum concentrically around said shaft such that the load is drawn in a direction perpendicular to the longitudinal axis of said shaft and centered beneath a midpoint of said shaft.

11. The hoist system of claim 10, wherein said hub portion comprises a helical structure.

12. The hoist system of claim 10, further comprising a second hub opposed to said at least one hub, the at least one hub and the second hub disposed about a center spherical bearing, said bearing rotationally coupled within said drum and to the hubs;
    said pivot such that said middle of said shaft remains substantially concentric with said drum and said hubs are displaced in substantially opposite directions.

13. The hoist system of claim 1, wherein the hoist system is configured for attachment to a semiconductor wafer transportation system.

14. A roller assembly for hoisting a semiconductor wafer load comprising:
    a drum having a hollow bore therethrough;
    a suspending member having one end fixed to the drum and an opposite end configured for attachment to the semiconductor wafer load;
    a shaft, having a longitudinal axis, disposed through said hollow bore of said drum and rotatably mountable to a support for rotation about the longitudinal axis; and a coupling between said shaft and said drum disposed to allow movement of said drum independent of the shaft through pivotal movement about two orthogonal axes in response to shifting of the load attached at the opposite end of the suspending member, said orthogonal axes further being orthogonal to said shaft.

15. The roller assembly of claim 14, wherein the coupling is disposed to allow pivotal movement of the drum about a plurality of pivot pins defining said orthogonal axes within a range of 3° away from the longitudinal axis of the shaft.

16. The roller assembly of claim 14, wherein the coupling is disposed to allow pivotal movement of the drum in a vertical plane about a plurality of pivot pins defining said orthogonal axes within a range of 3° away from the longitudinal axis of the shaft.

17. The roller assembly of claim 14, wherein the coupling is disposed to allow pivotal movement of the drum about a plurality of pivot pins defining said orthogonal axes to tend to return a center of gravity of the load to a point beneath the coupling.

18. The roller assembly of claim 14, wherein the coupling further comprises:

an outer ring attached within the hollow bore of the drum and having first opposed pivot holes aligned along a first axis;

an inner ring substantially concentric to said outer ring, said inner ring having second opposed pivot holes along said first axis, wherein said outer ring and said inner ring are in pivotal communication along said first axis through pivot pins extending through said first and second opposed pivot holes, said inner ring further comprising third opposed pivot holes on a second axis perpendicular to said first axis;

said first axis and said second axis both orthogonal to said shaft axis of rotation; and fourth opposed pivot holes through said shaft, said inner ring in pivotal communication with said shaft along said second axis through pivot pins extending through said third and fourth opposed pivot holes.

19. The roller assembly of claim 14, wherein the coupling further comprises:

at least one hub, said hub having a center bore and an outer rim and extending along a portion of said shaft; said center bore attached to said shaft and said outer rim attached within said drum, wherein a portion of said hub between said center bore and said outer rim is sufficiently deformable to allow relative movement between said shaft and said interior surface.

20. The roller assembly of claim 19, wherein said hub biases said drum concentrically around said shaft such that the load is drawn in a direction perpendicular to the longitudinal axis of said shaft and centered beneath a midpoint of said shaft.

21. The roller assembly of claim 19, wherein said hub portion comprises a helical structure.

22. The roller assembly of claim 19, further comprising a second hub opposed to said at least one hub, the at least one hub and the second hub disposed about a center spherical bearing, said bearing rotationally coupled within said drum and to the hubs;

said pivot such that said middle of said shaft remains substantially concentric with said drum and said hubs are displaced in substantially opposite directions.

23. The roller assembly of claim 14, wherein said drum further comprises a series of cogs, and said suspending element further comprises a series of apertures wherein said cogs engage said apertures as said drum is rotated.

24. The roller assembly of claim 14, wherein said suspending element further includes a series of elongated metal traces extending from said first end to said second end.

25. The roller assembly of claim 24, wherein said metal traces bear the weight of said load as said drum is rotated.

26. The roller assembly of claim 24, wherein said metal traces provide electrical communication between said first end and said second end.

27. The roller assembly of claim 24, wherein said metal traces are further electrically connected to conductors on said shaft, said conductors connected to a brush assembly, said brush assembly providing electrical communication from fixed electrodes to said metal traces through said shaft, and further that such electrical communication persists as said shaft is rotated.

28. The roller assembly of claim 14, further comprising a plurality of anti-nutation pins, said pins rotatably mounted to said drum; and a slot for receiving said anti-nutation pins, wherein said pins slidably engage said slot such that said pivotal movement is restricted to the direction of said slot.

29. The roller assembly of claim 14, further comprising a pair of elongated, opposed members, said opposed members in slidable communication with said drum such that said pivotal movement is restricted to the direction of extension of said opposed members.

30. The roller assembly of claim 14, wherein said pivotal movement is restricted to the plane defined by the shaft axis and vertical by a vertical slot through which said shaft axis extends.

* * * * *